United States Patent [19]

Ikeda

[11] Patent Number: 4,998,062

[45] Date of Patent: Mar. 5, 1991

[54] PROBE DEVICE HAVING MICRO-STRIP LINE STRUCTURE

[75] Inventor: Towl Ikeda, Kofu, Japan

[73] Assignee: Tokyo Electron Limited, Tokyo, Japan

[21] Appl. No.: 379,544

[22] Filed: Jul. 13, 1989

[30] Foreign Application Priority Data

Oct. 25, 1988 [JP] Japan .............................. 63-138985[U]

[51] Int. Cl.$^5$ ........................... G01R 1/02; G01R 1/04
[52] U.S. Cl. ................................ 324/158 F; 324/72.5; 324/158 P
[58] Field of Search ................. 524/72.5, 158 P, 158 F

[56] References Cited

U.S. PATENT DOCUMENTS

| 3,984,620 | 10/1976 | Robillard et al. | 324/158 F |
| 4,055,805 | 10/1977 | Ardezzone | 324/158 F |
| 4,593,243 | 6/1986 | Lao et al. | 333/238 |
| 4,697,143 | 9/1987 | Lockwood et al. | 324/158 P |
| 4,727,319 | 2/1988 | Shahriary | 324/72.5 |
| 4,740,746 | 4/1988 | Pollock et al. | 324/158 P |
| 4,764,723 | 8/1988 | Strid | 324/158 P |
| 4,827,211 | 5/1989 | Strid et al. | 324/158 P |
| 4,853,627 | 8/1989 | Gleason et al. | 324/158 P |

FOREIGN PATENT DOCUMENTS

| 0259162 | 3/1988 | European Pat. Off. | 324/158 P |
| 61-14659 | 4/1986 | Japan . | |
| 0238633 | 10/1987 | Japan | 324/158 P |
| 0290144 | 12/1987 | Japan | 324/158 P |
| 0017540 | 1/1988 | Japan | 324/158 P |
| 0206671 | 8/1988 | Japan | 324/158 F |
| 0252437 | 10/1988 | Japan | 324/158 P |
| 0118774 | 5/1989 | Japan | 324/158 P |

*Primary Examiner*—Kenneth Wieder
*Assistant Examiner*—William J. Burns
*Attorney, Agent, or Firm*—Oblon, Spivak, McClelland, Maier & Neustadt

[57] ABSTRACT

A probe device for measuring the electric characteristics of an IC chip on a wafer, etc. is disclosed. The probe device includes a unit having a micro-strip line structure in which a plurality of probes are integrally formed. The unit comprises a flexible insulating quartz base plate, a plurality of mutually insulated lead strips provided on one surface of the base plate, and a ground strip provided on the other surface of the base plate. Notches are formed in those regions of the insulating base plate, which are located between the lead strips at an end portion of the unit. The unit is supported such that the tip end portion of the unit is formed as a free-end portion and the unit is inclined by a predetermined angle toward electrode pads on the IC chip with respect to an imaginary horizontal plane. The combination of each of the lead strip, the insulating quartz base plate an the ground strip constitute a micro-strip line. At the tip end portion of the unit, each micro-strip line serves as the probe. A tip portion of each lead strip serves as a contact of the probe.

12 Claims, 2 Drawing Sheets

PROBE DEVICE HAVING MICRO-STRIP LINE STRUCTURE

BACKGROUND OF THE INVENTION

1. Field of the Invention

The present invention relates to a probe device for measuring electric characteristics of objects to be tested such as ICs or LSIs formed on a semiconductor wafer, and, in particular, to a probe device having probes formed by a micro-strip line technique for measuring high-frequency electric characteristics of the objects.

2. Description of the Prior Art

A number of electrodes are arranged on a semiconductor device such as an IC or LSI, or on a liquid crystal display substrate (LCD substrate). In order to test the electric characteristics of such electrodes, a probe device is employed. In this probe device, a number of probe needles are disposed on a probe card with a predetermined arrangement. The test of an object is carried out in a state wherein the tip end portions of the probe needles are brought into contact with the electrode pads of the object.

A higher degree of integration in recent semiconductor devices such as ICs or LSIs has led to an increase in the number of electrodes in semiconductor devices and to a decrease in size of electrodes. In accordance with this tendency, the probe needles of a probe device need to be reduced in size and increased in density. The reduction in size and increase in density of probe needles has inevitably made the manufacture and mounting of probe needles troublesome. In particular, in the case where a coaxial cable structure is employed in a probe needle in order to enhance the high-frequency characteristic of a probe device, the manufacture and mounting of small, high density probe needles has become very difficult. This difficulty results in a low reliability of the probe device.

It is also required that an automatic test be performed with the use of a probe device. When high-integration semiconductor devices such as ICs or LSIs, having a number of small and densely arranged electrodes, are to be tested, a probe device having a probe card with conventional probe needles has various disadvantages, because of the characteristics of the probe needles. For example, in this type of conventional probe device, exact positioning of the needles must be performed prior to a test.

As a technique for overcoming the drawbacks of the conventional probe device, Japanese Patent Publication No. 61-14659 discloses a structure wherein probe needles are produced by a micro-strip line technique. Basically, a micro-strip line has a structure of "metallic strip-insulation base plate-metallic strip", and the micro-strip line technique is well known as a wiring technique for transmission of high-frequency signals.

In the technique disclosed in Japanese Patent Publication No. 61-14659, micro-strip lines, the number of which is identical to the number of electrode pads on an object to be tested, are individually attached to the bottom surface of a test base plate or a probe card. A distal end portion of each micro-strip line is arranged so as to project into an opening formed at the center of the probe card. The distal end portion of each microstrip line serves as a probe, and the distal end portion of the lead strip of each line functions as a contact for each probe. A jig for bringing the distal end portions of the micro-strip lines or probes into pressurized contact with the electrodes on the object is provided above the opening. A common shock absorber is interposed between the jig and the micro-strip lines. This structure is advantageous in that the high frequency measuring characteristic can be enhanced by the use of a micro-strip line structure and the troublesome step of, for example, fine positioning of probes, as in the prior art, can be made unnecessary.

Owing to the high integration of semiconductor devices such as ICs or LSIs, the length of one side of a pad serving as an electrode in a semiconductor device between adjacent pads is about 70 to 110 $\mu$m. In accordance with the size of the pad, the width of a microstrip probe is set to about 50 to 80 $\mu$m. Under this circumstance, the desirable electric contact cannot be achieved by the above structure, wherein a common shock absorber is interposed between all micro-strip probes and the jig, thereby pressing each micro-strip line, which has a width of the unit of $\mu$m, onto each electrode pad. This is because the electrode pads have uneven heights and the levels of adjacent pads are not equal.

In addition, in order to achieve a stable characteristic impedance in a micro-strip line, it is desirable that the width of the ground strip, located opposite each lead strip, which is put in contact with the electrode pad, be as large as possible. In an actual probe device, it is necessary to make the width of the ground strip sufficiently larger than the width of the lead strip. However, in the above conventional structure, the width of the lead strip is substantially equal to that of the ground strip.

SUMMARY OF THE INVENTION

An object of the present invention is to provide a probe device wherein a number of probes corresponding to electrodes, which are miniaturized and densely arranged on an IC or an LSI, are precisely arranged by a microstrip line technique.

Another object of the present invention is to provide a probe device wherein probes can be easily and surely brought into contact with uneven electrode pads on an object to be tested, so that an automatic test can be performed exactly.

Still another object of the invention is to provide a probe device wherein the characteristic impedance of probes is stabilized so that the high-frequency characteristics of the probe device can be enhanced.

In order to achieve the above objects, in the probe device of the present invention, probes corresponding to a plurality of electrode pads on an object to be tested are integrally formed on a unit having a micro-strip line structure. The unit comprises an flexible insulating base plate, lead strips provided on one surface of the insulating base plate, and ground strip means provided on the other surface of the insulating base plate. The lead strips are separated and electrically insulated from one another. The combination of each lead strip, the insulating base plate, and the ground strip means constitutes a micro-strip line corresponding to each electrode pad, each micro-strip line serves as the probe at the tip end portion of the unit, and a tip portion of each lead strip serves as the contact of each probe.

Notches may be formed in those regions of the insulating base plate which are located between the lead strips at an end portion of the unit. By virtue of the notches, the probes formed by the tip portions of the lines can be individually and flexibleally moved.

The unit may be supported such that the tip end portion of the unit is inclined at a predetermined angle, preferably 15° ±5°, toward the electrode pads, with respect to an imaginary horizontal plane. By this inclination, the electric contact between the probes and the electrode pads can be ensured.

The ground strip means may be formed as a single strip extending over substantially all of the other surface of the insulating base plate. In order to obtain a stable characteristic impedance, it is desirable that the width of the ground strip be sufficiently greater than that of the lead strip.

The unit may be supported such that the tip end portion of the unit serves as an free-end portion. It is possible, however, to provide a cushion on the back side of the tip end portion of the unit.

The insulating base plate may be formed of a thin quartz plate which is cut out so that the optical axis or Z-axis of quartz is normal to the surface of the quartz thin plate. The selection of the cut-out face of the quartz is made in consideration of the efficiency of an etching process.

The other features and advantages of the present invention will be made clear from the following description given with reference to the accompanying drawings.

DETAILED DESCRIPTION OF THE PREFERRED EMBODIMENT

Figure 1:
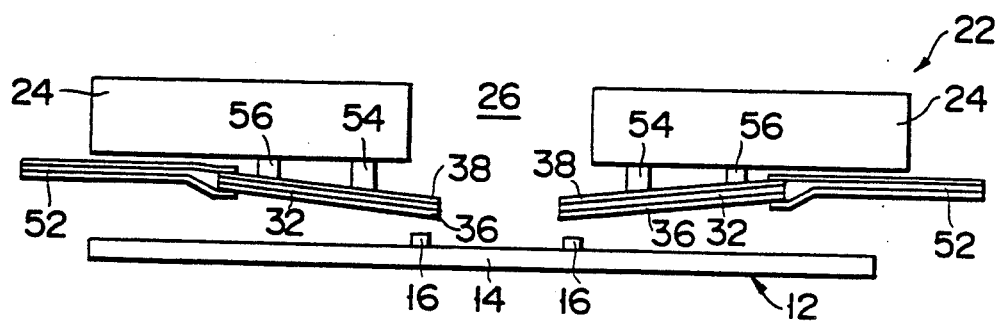
FIG. 1 is a vertical cross section of an important part of a probe device according to an embodiment of the present invention, wherein an IC chip on a wafer is employed as the object to be tested.
Figure 2:
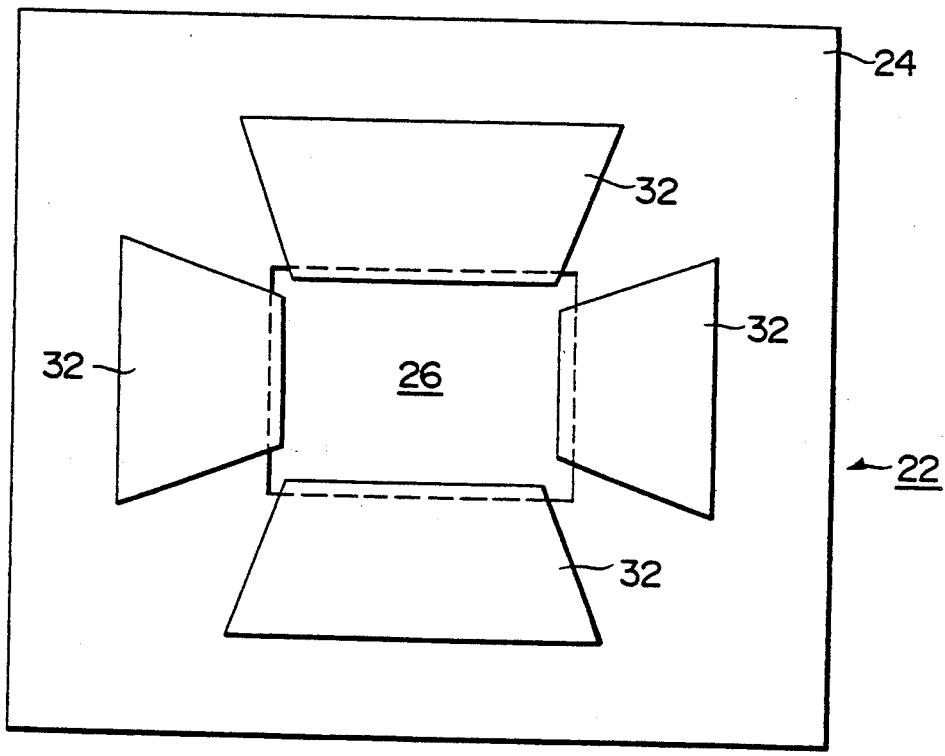
FIG. 2 is a plan view of a probe card used in the probe device shown in FIG. 1.

FIG. 1 shows an important part of a probe device according to an embodiment of the present invention. As shown in FIG. 1, the test head of the probe device, which faces an IC chip 14 formed on a wafer 12 or an object to be tested, is mainly composed of a probe card 22. A support plate 24 for supporting the probe card 22 has an opening 26 at its central part, as shown in FIG. 2. Four micro-strip line units 32 are arranged around the opening 26, such that the end portions of the units 32 project into the opening 26.

Figure 3:
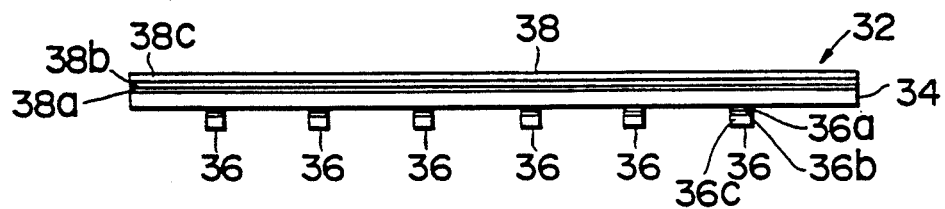
FIG. 3 is a cross sectional view of a micro-strip line unit in the probe device shown in FIG. 1.

As shown in FIG. 3, each micro-strip line unit 32 comprises an insulated base plate 34, lead strips 36 formed on one surface of the base plate 34, and a ground strip 38 formed on the other surface of the base plate 34. As will be described later in detail, a micro-strip line, corresponding to each electrode pad 16 on the object, is constituted by each of divided lead strips 36, the insulated base plate 34 and the ground strip 38. At the end part of the unit 34, the micro-strip lines 36 serve as probes 42. An end portion of each lead strip 36 functions as a contact 44 of the probe 42.

The insulated base plate 34 is formed of a thin plate, having a depth of about 100 μm, which is cut from a single quartz crystal having good insulating properties. The optical axis of the quartz is normal to the surface of the plate. The quartz crystal inherently has low flexibility (Young's modulus: 7800 kgf/mm$^2$). The base plate 34, however, has elasticity by virtue of its thinness. The flexibleity is hardly affected by heat and hardly changes with the lapse of time. The material of the insulated base plate 34 is not limited to quartz crystal, and ceramics, for example, may also be used.

Figure 4:
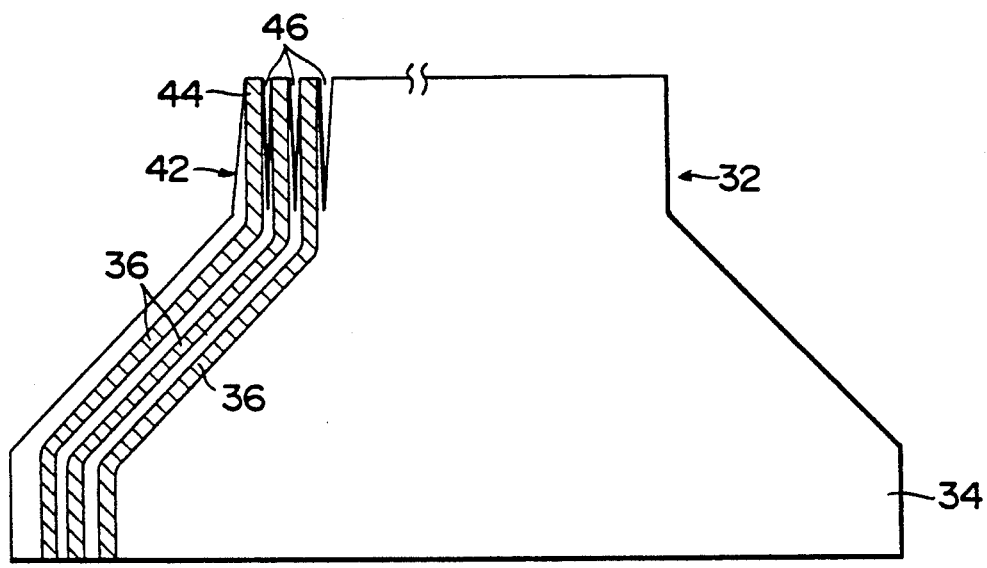
FIG. 4 is a bottom view of the micro-strip line unit in the probe device shown in FIG. 1.

FIG. 4 shows a pattern of the lead strips 36. The strips 36 are separated and insulated from one another. A free-end-side portion of each strip 36, which is in the probe 42, is made to face the electrode pad 16 on an IC chip. In principle, the lead strips 36 have the same width and the same length, so that the skew of signals due to variation in strip length can be prevented. It is, however, desirable that the width of the strip for power supply be greater than that of the strip for transmission of signals. Furthermore, in order to prevent the reflection of propagated waves, the lead strips 36 are so formed as to eliminate angularly bent portions. For example, the junction of two straight portions is tangentially curved, and the tip portion is curved.

The lead strip 36 has a multi-metallic-layer structure. At first, a chrome (Cr) layer 36a having a thickness of about 500 Å, which has a high wettability with quartz, is formed on the quartz base plate 34. On the resultant structure, a gold (Au) layer 36b having a thickness of about 500 Å, and high wettability with chrome, is formed. The combination of the chrome layer and gold layer serves as a base film. The base film is coated with a conductive layer 36c having a thickness of about 3 to 5 μm, which serves as a passage for electric inspection signals. The conductive layer is made of high-conductivity material such as gold, silver or copper.

The ground strip 38 is composed of a single strip provided over the entire surface of the quartz base plate 34. The ground strip 38 functions as a ground electrode. If necessary, it is possible to provide ground strips, which correspond to the lead strips, and make the width of each ground strip larger than that of each lead strip.

The multi-metallic-layer structure of the ground strip is the same as that of each lead strip. In other words, a chrome (Cr) layer 38a having a thickness of about 500 Å, which has a high wettability with quartz, is formed on the quartz base plate 34. On the resulting structure, a gold (Au) layer 38b having a thickness of about 500 Å, and high wettability with chrome, is formed. The combination of the chrome layer and gold layer serves as a base film. The base film is coated with a conductive layer 38c having a thickness of about 3 to 5 μm, which serves as a passage for electric inspection signals.

At the tip end portion of the micro-strip line unit 32, notches 46 are formed in the base plate 34 such that the notches 46 are located between every adjacent pair of lead strips or probes 42. The notches 46 are formed by an etching technique, by making use of the variation in the etching rate of the quartz based on the surface azimuth when a chemical, for example a water solution of ammonium fluoride (NH$_4$F), is employed as an etchant. The length of each notch is 1.875 mm and the width thereof is 50–80 μm at the open end. These values of the size of each notch are determined in consideration of the Young's modulus (7800 kgf/mm$^2$) and the thickness (100 μm) of the quartz base plate. Namely, the desirable size of the notch varies in accordance with the material, thickness, etc. of the base plate.

A rear end portion of the micro-strip line unit 32 is connected to one end portion of a flexible printed wiring board 52 which has the same micro-strip line structure as is employed in the unit 32. Also, the flexible printed wiring board 52 has the same characteristic impedance as the micro-strip line unit 32, for example, 50 ohms. The other end portion of the printed wiring board is directly connected to the input/output terminals of a tester (not shown) for testing electric characteristics. Thus, wires having the same characteristic impedance, for example, 50 ohms, are for connection between electrode pads 16 on the IC chip, or the object to be tested, and the input/output terminals of the tester, and it becomes possible to use high-frequency measuring waves of 100 GHz or above.

The support plate 24 is made of a material such as ceramics, so that the plate 24 can have an insulation quality and can be prevented from being deformed in a working process. The size of the opening 26 in the support plate 24 is determined to be somewhat larger than the size which can surround the electrode pads on the IC chip. Columns of first projections 54 and second projections 56 for connecting the support plate 24 and the unit 32 are attached to the bottom surface of the support plate 24. The first and second projections 54 and 56 are arranged in a radial manner. For example, two first projections 54 and two second projections 56 are provided along each side of the opening 26. Each of the projections 54 and 56 is made of an insulating, hard material, and is fixed on the bottom surface of the support plate 24 by means of a resin-based adhesive. The length of each first projection 54 is made larger than that of each second projection 56, so that the unit 32 can be inclined toward the IC chip 14 by 15°±5°, with respect to an imaginary horizontal plane.

Each unit 32 is positioned so that the probe 42 at its tip end portion can face the corresponding electrode pad 16. Each unit 32 is fixed on the first and second projections 54 and 56 by an epoxy-resin-based adhesive. The unit 32 is fixed on the projections 54 and 56 after the rear end portion of unit 32 has been connected to the flexible printed wiring board 52. Thus, the printed wiring board 52 is fixed on the bottom surface of the support plate 24, at the same time as the unit 32 is fixed on projections 54 and 56.

In the embodiment shown in the drawings, the four units 32, so arranged as to correspond to the four sides of the opening 26 of the support plate 24, provide the same number of probes 42 as the electrode pads 16 on the object to be inspected. It is, however, possible to provide the same number of probes as the electrode pads by using only one unit. In this case, a disc-like unit having an opening, along which probes are arranged, may be used. Though such a single disc-like unit could be used, it is desirable to use a plurality of units, as in the embodiment, since, in the case of probe malfunction, only the defective unit need be replaced. In addition, in the case of using plural units, the adjustment of the position of the probes is easy.

A process of manufacturing the micro-strip line units 32 will now be described.

In a vacuum chamber of a sputter device, chrome which has high wettability with quartz is sputtered on both side surfaces of the quartz base plate 34, following which a chrome layer 36a, 38a, having a thickness of about 500 Å and serving as a first base film, is formed. Then, a gold layer 36b, 38b, having a high wettability with chrome is formed over the chrome layer by means of sputtering. The formed gold layer has a thickness of about500 Å, and serves as a second base film. A metallic layer 36c, 38c, having a thickness of about 3 to 5 μm and high electric conductivity, is electroplated on the resulting structure as an electrically conductive layer. Not only gold, but also silver or copper, may be used as material for the electrically conductive layer. When silver or copper is used, it is desirable that an oxidation prevention layer of gold, which has a thickness of about 2 μm, be electroplated on the silver or copper.

After the metallic layer is formed, photoresists are formed over both side surfaces of the base plate 34, and the photoresists are exposed and developed. Then, those portions of the photoresists, on which metallic strips are to be formed, are left, and the other portions are removed. The exposed metallic layers are removed by wet etching, and the surface areas of the base plate, which are located between the lead strips and at the end of the ground strip where the notches 46 are to be formed, are exposed. As a result, when the photoresists are removed, a pattern of lead strips 36 is obtained on one surface of the base plate, and ground strip 38 is obtained on the other surface.

Photoresists are applied, once again, to both surfaces of the base plate 34, and are exposed and developed. Those portions of the photoresists at which the notches 46 in the tip end portion of the unit are to be formed, are removed. The resulting exposed areas of the quartz layer are removed by wet etching, using an etchant such as a water solution of ammonium fluoride ($NH_4F$). As a result, the notches 46 are formed. In this process, a variation in etching rate based on the surface azimuth of the quartz layer is utilized. Generally, when ammonium fluoride is used as an etchant, the etching rate in the surface azimuth of a quartz layer can be represented by $X:Y:Z=6:1:100$ (Z: an optical axis or Z-axis of quartz; X: an X-axis connecting diagonal lines of a hexagon in a direction perpendicular to the Z-axis; Y: an etching rate along the remaining Y-axis). Since the base plate 34 is cut out so that the X-axis is normal to the surface of the base plate, the etching can be selectively performed in the direction of thickness, and notches of desired size can be formed. By this process, the micro-strip line units 32 of the desired structure can be obtained.

The testing operation of the probe device of the present invention will now be described.

The wafer 12, on which the IC chip 16 or the object to be tested is formed, is positioned so as to face the probe card 22 of the probe device. While the probe card 22 is substantially fixed, the wafer 12 is raised to a predetermined level, so that the contact 44 of each probe, i.e., a tip end portion of each lead strip 36, is brought into contact with the corresponding electrode pad 16 on the IC chip 16. Then, the wafer 12 is further raised. Namely, the wafer 12 is overdriven. At this time, the tip end portions or free-end portions of the quartz base plate 34, which are separated by the notches 46 to constitute the corresponding probes 42, are moved upward in opposition to their own flexibility. Thus, close electric contact between the contacts 44 of probes 42 and the electrode pads 16 can be achieved. In the case where oxide films are formed over the surfaces of electrode pads 16 of the object to be tested, or the surfaces of electrode pads 16 are contaminated, the surfaces of electrode pads 16 are abraded, and the desired surface of pads 16 can be obtained. Generally, the heights of electrode pads 16 on the IC chip are not equal, and there is a variation in height between adjacent pads 16. In the present invention, since the probes 42 can be individually bent by virtue of the notches 46 cut in the tip portion of the quartz base plate, reliable electric contact can be realized, irrespective of any non-uniformity in the height of the pads 16.

When each tester is electrically connected to each IC chip 14, a test signal output from the tester is supplied through probe 42 to an input electrode of IC chip 14. Then, a signal output from an output electrode of the IC chip 14 is fed back to the tester through the probe 42. A predetermined test is thus performed. Since the contacts of the probes and the input/output terminals of the tester are connected by wires having a constant characteristic impedance, the test can be performed by using a high-frequency measuring signal of 100 GHz or above. After the test, the wafer 12 is lowered, and the probe 42 loses contact with the electrode pad 16. At this time, the divided tip end portions of the quartz base plate 34, which are individually separated by the notches 46 so as to correspond to the respective probes 24, return to their original state by virtue of their own restoring force.

In the above, the preferred embodiment of the present invention has been described in detail, with reference to the accompanying drawings. However, it is obvious that various modifications and changes may be made to the above embodiment, within the scope of the subject matter of the present invention.

What is claimed is:

1. A probe device for measuring electric characteristics of an object to be tested, with a plurality of electrode pads attached on the object being brought into contact with corresponding probes of the probe device, including a unit having a micro-strip line structure for providing said probes, wherein said unit comprises a flexible insulating base plate, lead strips provided on one surface of said base plate, and ground strip means provided on the other surface of said base plate, said lead strips are separated and electrically insulated from one another, said base plate comprises a thin crystal plate cut such that an optical axis or Z-axis thereof becomes normal to said both surfaces of said base plate, said base plate has a substantially uniform thickness as a whole, and each of said lead strips has a width substantially uniform over the entire length thereof, said lead strips and said ground strip means extend to a tip end of said base plate, and each of said lead strips is aligned with a corresponding part of said ground strip means, with said base plate being interposed therebetween, notches are formed in said tip end of said base plate at locations between said lead strips, and the combination of each of said lead strips, said insulating base plate and said ground trip means constitute a micro-strip line corresponding to each of said electrode pads, said micro-strip line having a constant impedance characteristic over the entire length thereof, said micro-strip line serves as one of said probes at said tip end of said base plate, and a tip portion of said lead strip of said micro-strip line serves as a contact of one of said probes.

2. The probe device as claimed in claim 1, wherein said unit is supported, with said tip end of said base plate being inclined toward said electrode pads.

3. The probe device as claimed in claim 1, wherein each of said lead strips has an underlining film containing chromium and contacting said base plate.

4. The probe device according to claim 1, wherein said unit is supported such that the tip end portion of the unit serves as a free-end portion.

5. The probe device according to claim 1 wherein said ground strip means is formed as a single strip extending over substantially all of said other surface of the insulating base plate.

6. The probe device according to claim 2 wherein the tip end portion of said unit is inclined by 15° ±5° toward said electrode pads with respect to an imaginary horizontal plane.

7. The probe device according to claim 1, wherein said probe device is designed to measure the high-frequency electric characteristics of said object.

8. A probe device for measuring electric characteristics of an object to be tested, with a plurality of electrode pads attached on the object being brought into contact with corresponding probes of the probe device, including a unit having micro-strip line structure for providing said probes, wherein said unit comprises a flexible insulating base plate, lead strips provided on one surface of said base plate, and ground strip means provided on the other surface of said base plate, only said lead strips are provided on said one surface of said base plate, and separated and electrically insulated from one another, said insulating base plate is formed of a thin quartz plate which is cut out so that the optical axis or Z-axis of quartz is normal to said both surfaces of said base plate, said base plate has a substantially uniform thickness as a whole, and each of said lead strips has a width substantially uniform over the entire length thereof, said lead strips and said ground strip means extend to a tip end of the base plate, and each of said lead strips is aligned with a corresponding part of said ground strip means, with said base plate being interposed therebetween, notches are formed in said tip end of said base plate at locations between said lead strips, each of said units is supported, with said tip end of said base plate being inclined toward said electrode pads, and the combination of each of said lead strips, said insulating base plate and said ground strip means constitutes a micro-strip line corresponding to each of said electrode pads, said micro-strip line having a constant impedance characteristic over the entire length thereof, said microstrip line serves as one of said probes at said tip end of said base plate, and a tip portion of said lead strip of said micro-strip line serves as a contact of one of said probes.

9. The probe device according to claim 8, wherein said unit is supported such that the tip end portion of the unit serves as a free-end portion.

10. The probe device according to claim 8, wherein said ground strip means is formed as a single strip extending over substantially all of said other surface of the insulating base plate.

11. The probe device according to claim 8, wherein said tip end portion of said unit is inclined by 15°±5° toward said electrode pads with respect to an imaginary horizontal plane.

12. The probe device according to claim 8, wherein said probe device is designed to measure the high frequency electric characteristics of the object.

* * * * *